(12) United States Patent
Kawasumi

(10) Patent No.: US 11,955,178 B2
(45) Date of Patent: Apr. 9, 2024

(54) INFORMATION PROCESSING APPARATUS AND MEMORY SYSTEM

(71) Applicant: Kioxia Corporation, Tokyo (JP)

(72) Inventor: Atsushi Kawasumi, Fujisawa Kanagawa (JP)

(73) Assignee: Kioxia Corporation, Tokyo (JP)

(*) Notice: Subject to any disclaimer, the term of this patent is extended or adjusted under 35 U.S.C. 154(b) by 207 days.

(21) Appl. No.: 17/695,278

(22) Filed: Mar. 15, 2022

(65) Prior Publication Data

US 2023/0090235 A1 Mar. 23, 2023

(30) Foreign Application Priority Data

Sep. 17, 2021 (JP) .................................. 2021-152618

(51) Int. Cl.
| | |
|---|---|
| *G11C 7/00* | (2006.01) |
| *G11C 16/04* | (2006.01) |
| *G11C 16/10* | (2006.01) |
| *G11C 16/26* | (2006.01) |

(52) U.S. Cl.
CPC .......... *G11C 16/0483* (2013.01); *G11C 16/10* (2013.01); *G11C 16/26* (2013.01)

(58) Field of Classification Search
CPC ..... G11C 16/0483; G11C 16/10; G11C 16/26; G11C 7/1006
See application file for complete search history.

(56) References Cited

U.S. PATENT DOCUMENTS

| | | | |
|---|---|---|---|
| 8,780,632 B2 | 7/2014 | Sprouse et al. | |
| 9,690,652 B2 | 6/2017 | Kanno | |
| 10,579,683 B2 | 3/2020 | Marukame et al. | |
| 2009/0323432 A1* | 12/2009 | Futatsuyama | G11C 16/3454 365/185.25 |
| 2011/0228587 A1* | 9/2011 | Ito | G11C 13/0023 257/E21.004 |
| 2012/0033512 A1* | 2/2012 | Takase | G11C 13/0033 365/205 |
| 2012/0069653 A1* | 3/2012 | Morikado | G11C 11/5628 365/185.03 |
| 2013/0250651 A1* | 9/2013 | Sills | G11C 13/0038 365/148 |

(Continued)

FOREIGN PATENT DOCUMENTS

| | | |
|---|---|---|
| JP | 6258436 B2 | 1/2018 |
| JP | 6297000 B2 | 3/2018 |

*Primary Examiner* — Hien N Nguyen
(74) *Attorney, Agent, or Firm* — Foley & Lardner LLP

(57) ABSTRACT

An information processing apparatus has strings connected to a first wiring and connected to second wirings. The string has one end connected to the first wiring and includes transistors being connected to each other, gates of which are connected to the second wirings. The transistors include a first transistor and a second transistor. The first transistor is set to a first threshold according to first data, and the second transistor is set to a second threshold according to second data in a complement relationship with the first data. Two second wirings of the second wirings are connected to gates of the first transistor and the second transistor, and one of the two second wirings is set to a potential level corresponding to third data, and another is set to a potential level corresponding to fourth data in a complement relationship with the third data.

20 Claims, 9 Drawing Sheets

(56) References Cited

U.S. PATENT DOCUMENTS

| | | | | |
|---|---|---|---|---|
| 2013/0328005 | A1* | 12/2013 | Shin | H10B 63/34 257/1 |
| 2021/0217473 | A1* | 7/2021 | Cho | G11C 13/0007 |
| 2022/0393106 | A1* | 12/2022 | Takahashi | G11C 13/003 |

* cited by examiner

| KEY | Q1 | Q2 |
|---|---|---|
| 0 | Vth_low | Vth_high |
| 1 | Vth_high | Vth_low |
| X | Vth_low | Vth_low |

| QUERY | Q1 | Q2 |
|---|---|---|
| 0 | Vread | Vpass |
| 1 | Vpass | Vread |
| X | Vpass | Vpass |

|  |  | QUERY | | |
|---|---|---|---|---|
|  |  | 0 | 1 | X |
| KEY | 0 | ON/ON ON | ON/OFF OFF | ON/ON ON |
|  | 1 | OFF/OFF OFF | ON/ON ON | ON/ON ON |
|  | X | ON/ON ON | ON/ON ON | ON/ON ON |

FIG. 6

| QUERY | | KEY | | | |
|---|---|---|---|---|---|
| 1 |  | 0 | 1 | 1 | 0 |
| 1 | ⇒ | 1 | 1 | 1 | 1 |
| 1 |  | 0 | 0 | 1 | 1 |
| 0 |  | 0 | 0 | 0 | 1 |
|  |  | ↓ | ↓ | ↓ | ↓ |
|  |  | 2 | 3 | 4 | 2 |

FIG. 7

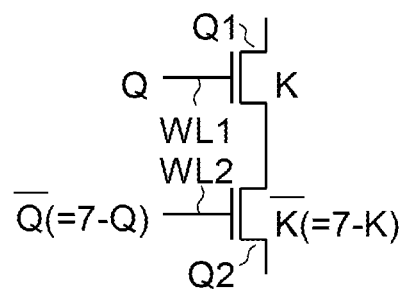
FIG. 8
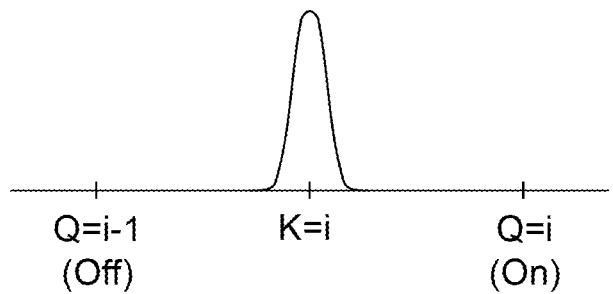
FIG. 9
FIG. 10

| | | QUERY | | | | | | | |
|---|---|---|---|---|---|---|---|---|---|
| | | 0/7 | 1/6 | 2/5 | 3/4 | 4/3 | 5/2 | 6/1 | 7/0 |
| KEY | 0/7 | ON/ON ON | ON/OFF OFF | ON/OFF OFF | ON/OFF OFF | ON/OFF OFF | ON/OFF OFF | ON/OFF OFF | ON/OFF OFF |
| | 1/6 | OFF/ON OFF | ON/ON ON | ON/OFF OFF | ON/OFF OFF | ON/OFF OFF | ON/OFF OFF | ON/OFF OFF | ON/OFF OFF |
| | 2/5 | OFF/ON OFF | OFF/ON OFF | ON/ON ON | ON/OFF OFF | ON/OFF OFF | ON/OFF OFF | ON/OFF OFF | ON/OFF OFF |
| | 3/4 | OFF/ON OFF | OFF/ON OFF | OFF/ON OFF | ON/ON ON | ON/OFF OFF | ON/OFF OFF | ON/OFF OFF | ON/OFF OFF |
| | 4/3 | OFF/ON OFF | OFF/ON OFF | OFF/ON OFF | OFF/ON OFF | ON/ON ON | ON/OFF OFF | ON/OFF OFF | ON/OFF OFF |
| | 5/2 | OFF/ON OFF | OFF/ON OFF | OFF/ON OFF | OFF/ON OFF | OFF/ON OFF | ON/ON ON | ON/OFF OFF | ON/OFF OFF |
| | 6/1 | OFF/ON OFF | OFF/ON OFF | OFF/ON OFF | OFF/ON OFF | OFF/ON OFF | OFF/ON OFF | ON/ON ON | ON/OFF OFF |
| | 7/0 | OFF/ON OFF | OFF/ON OFF | OFF/ON OFF | OFF/ON OFF | OFF/ON OFF | OFF/ON OFF | OFF/ON OFF | ON/ON ON |

FIG. 11

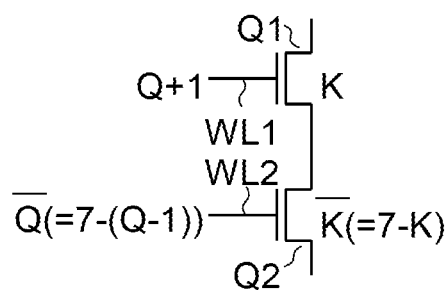

FIG. 12

|     |     | QUERY | | | | | | | |
| --- | --- | --- | --- | --- | --- | --- | --- | --- | --- |
|     |     | 0/7 | 1/6 | 2/5 | 3/4 | 4/3 | 5/2 | 6/1 | 7/0 |
| KEY | 0/7 | ON/ON ON | ON/ON ON | ON/OFF OFF | ON/OFF OFF | ON/OFF OFF | ON/OFF OFF | ON/OFF OFF | ON/OFF OFF |
|     | 1/6 | ON/ON ON | ON/ON ON | ON/ON ON | ON/OFF OFF | ON/OFF OFF | ON/OFF OFF | ON/OFF OFF | ON/OFF OFF |
|     | 2/5 | OFF/ON OFF | ON/ON ON | ON/ON ON | ON/ON ON | ON/OFF OFF | ON/OFF OFF | ON/OFF OFF | ON/OFF OFF |
|     | 3/4 | OFF/ON OFF | OFF/ON OFF | ON/ON ON | ON/ON ON | ON/ON ON | ON/OFF OFF | ON/OFF OFF | ON/OFF OFF |
|     | 4/3 | OFF/ON OFF | OFF/ON OFF | OFF/ON OFF | ON/ON ON | ON/ON ON | ON/ON ON | ON/OFF OFF | ON/OFF OFF |
|     | 5/2 | OFF/ON OFF | OFF/ON OFF | OFF/ON OFF | OFF/ON OFF | ON/ON ON | ON/ON ON | ON/ON ON | ON/OFF OFF |
|     | 6/1 | OFF/ON OFF | OFF/ON OFF | OFF/ON OFF | OFF/ON OFF | OFF/ON OFF | ON/ON ON | ON/ON ON | ON/ON ON |
|     | 7/0 | OFF/ON OFF | OFF/ON OFF | OFF/ON OFF | OFF/ON OFF | OFF/ON OFF | OFF/ON OFF | ON/ON ON | ON/ON ON |

FIG. 13

INFORMATION PROCESSING APPARATUS AND MEMORY SYSTEM

CROSS REFERENCE TO RELATED APPLICATIONS

This application is based upon and claims the benefit of priority from the prior Japanese Patent Application No. 2021-152618, filed on Sep. 17, 2021, the entire contents of which are incorporated herein by reference.

FIELD

An embodiment of the present invention relates to an information processing apparatus and a memory system.

BACKGROUND

Processing of big data requires a technique for determining at high speed whether or not data including a plurality of bits match each other. Since there is a limitation in speed for such a technique to be performed by software, research and development for processing big data using general-purpose hardware has been advanced.

For example, comparison between image data is required to quickly and accurately determine not only whether the image data completely match but also whether or not the image data are similar to each other.

BRIEF DESCRIPTION OF THE DRAWINGS

FIG. 6 is a view illustrating all combinations of bits of a query and a key;

FIG. 7 is a view illustrating a specific example of the query and the key;

FIG. 8 is a view illustrating an example in which each bit of the query and the key is multi-valued data;

FIG. 9 is a view illustrating the first transistor and the second transistor in a string 1 in a case where each bit of the query and the key is 3-bit multi-valued data;

FIG. 10 is a view illustrating a relationship between the threshold and the gate voltage of the first transistor and the second transistor;

FIG. 11 is a view illustrating a correspondence relationship between multi-valued data of each bit of a query and a key in the first embodiment;

FIG. 12 is a view illustrating the first transistor and the second transistor in a string according to a second embodiment;

FIG. 13 is a view illustrating a correspondence relationship between multi-valued data of each bit of a query and a key in the second embodiment;

DETAILED DESCRIPTION

An information processing apparatus has strings connected to a first wiring and connected to second wirings, wherein the string has one end connected to the first wiring and includes a plurality of transistors being connected to each other, each of gates of the plurality of transistors is connected to corresponding one of the second wirings, the transistors include a first transistor and a second transistor, the first transistor being set to a first threshold according to first data, and the second transistor being set to a second threshold according to second data in a complement relationship with the first data, two second wirings of the second wirings are connected to gates of the first transistor and the second transistor, and one of the two second wirings is set to a potential level corresponding to third data, and another of the two second wirings is set to a potential level corresponding to fourth data in a complement relationship with the third data.

First Embodiment

Figure 1:
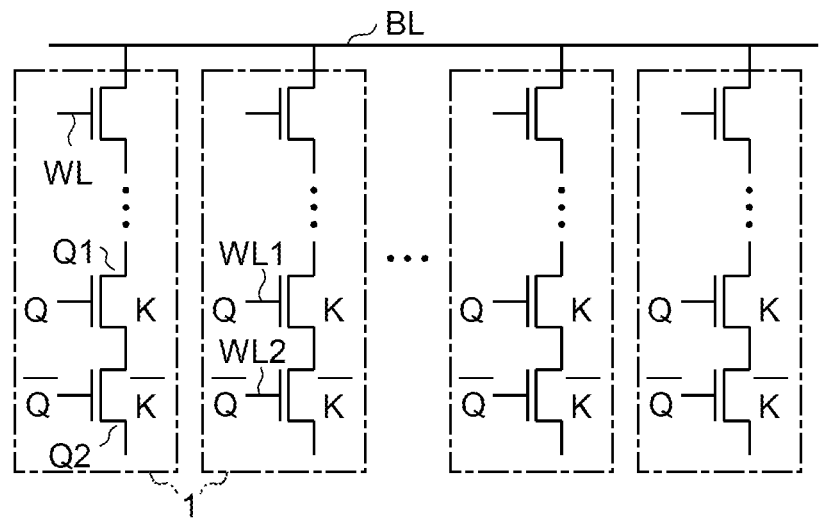
FIG. 1 is a circuit diagram illustrating a plurality of strings included in an information processing apparatus and a memory system according to a first embodiment.

FIG. 1 is a circuit diagram illustrating a plurality of the strings 1 included in the information processing apparatus and the memory system according to the first embodiment. The plurality of the strings 1 illustrated in FIG. 1 are at least a part of a memory cell array in a semiconductor memory, for example. Here, the semiconductor memory is a nonvolatile memory such as a NAND flash memory, a resistive random access memory (ReRAM), and a phase-change memory (PCM). Alternatively, the semiconductor memory described above may be a volatile memory such as a dynamic RAM (DRAM) and a static RAM (SRAM). The present description mainly describes an example using the string 1 of an NAND flash memory.

Each string 1 illustrated in FIG. 1 has a plurality of cascode-connected transistors. Each transistor is, for example, an NMOS transistor. One end of each of the plurality of the strings 1 is connected to a same bit line (first wiring) BL.

Different word lines WL from one another are connected to the gates of the plurality of transistors in each string 1. The plurality of transistors store data supplied via the bit line BL in a state where a word line WL connected to each gate is set to a predetermined potential level. For example, in the case of the string 1 of the NAND flash memory, each transistor in the string 1 stores a charge according to data to a floating gate or a charge storage film. By storing data in the transistor, the threshold of the transistor changes. When the threshold of the transistor changes, the potential level at which the transistor is turned on changes.

Among the plurality of transistors in each string 1, a first transistor Q1 and a second transistor Q2 are used to store the key K including a plurality of bits. In the present embodiment, it is assumed that each bit of the key K is multi-valued data. First, an example in which each bit of the key K is binary (0 or 1) will be described. The value of each bit of the key K is stored in the first transistor Q1 and the second transistor Q2 in separate strings 1. The first transistor Q1 in each string 1 stores a value of a corresponding bit of the key K, and the second transistor Q2 cascode-connected to the first transistor Q1 stores a value in a complement relationship with the value of the corresponding bit of the key K. The value in a complement relationship is bit-inverted data. For example, when the first transistor Q1 stores 0, the second transistor Q2 stores 1. In the present description, the key K including a plurality of bits is referred to as first data, and the complement data of the key K is referred to as second data.

In the present description, that the first transistor Q1 stores 0 means that the threshold of the first transistor Q1 is set to 0. In practice, the threshold of the first transistor Q1 is set to a potential level corresponding to 0, but in the present description, for the sake of simplicity, it is assumed that the threshold is set to 0.

Third data and fourth data are supplied to two word lines WL1 and WL2 connected to the gates of the first transistor Q1 and the second transistor Q2, respectively, among the plurality of transistors in the string 1. The third data and the fourth data each include a plurality of bits, and the fourth data is data in a complement relationship of the third data. That is, the data obtained by inverting each bit of the third data is the fourth data. Each bit of the third data and the fourth data is assumed to be multi-valued data having a potential level of three values or more. First, an example in which each bit of the third data and the fourth data is binary (0 or 1) will be described.

The information processing apparatus according to the present embodiment can check whether or not a query Q input from the outside matches the key K stored in the plurality of the strings 1 and output the result.

The query Q and the key K each include a plurality of bits, and are compared for each bit. In the present description, the key K is sometimes referred to as first data, and the query Q is sometimes referred to as third data. Data in a complement relationship with the first data is referred to as second data, and data in a complement relationship with the third data is referred to as fourth data.

In the present embodiment, the key K is stored in the first transistor Q1 in each string 1, and complement data of the key K is stored in the second transistor Q2. Each string 1 stores a separate bit of the key K. The bits of the query Q are sequentially input from the word line WL connected to the gates of the first transistor Q1 and the second transistor Q2 in each string 1, and the corresponding bits of the query Q and the key K are compared in the first transistor Q1 and the second transistor Q2 in the corresponding string 1. For example, when both the third data representing the query Q and the first data representing the key K are 4-bit data, the least significant bits of the first data and the third data are compared with each other in the leftmost string 1, the second least significant bits are compared with each other in the second string 1 from the left, the second most significant bits are compared with each other in the third string 1 from the left, and the most significant bits are compared with each other in the fourth string 1 from the left.

The word lines WL1 connected to the gates of the first transistors Q1 in the plurality of the strings 1 may be common or may be separate. Similarly, the word lines WL2 connected to the gates of the second transistors Q2 in the plurality of the strings 1 may be common or may be separate. When the word lines WL1 connected to the gates of the first transistors Q1 in all the strings 1 are common and the word lines WL2 connected to the gates of the second transistors Q2 in all the strings 1 are common, the values of the bits of the query Q are supplied to the common word lines WL1 and WL2 at different timings. On the other hand, when the word lines WL1 connected to the gates of the first transistors Q1 in each string 1 are provided separately and the word lines WL2 connected to the gates of the second transistor Q2 in each string 1 are provided separately, all bits of the query Q can be supplied to the plurality of corresponding word lines WL1 and WL2 at the same timing.

Figure 2:
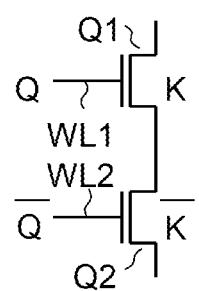
FIG. 2 is a view in which a first transistor and a second transistor in each string are extracted.

FIG. 2 is a view in which the first transistor Q1 and the second transistor Q2 in each string 1 are extracted. As illustrated in FIG. 2, the corresponding bit of the key K (first data) stored in the first transistor Q1 and the corresponding bit of the key/K (second data) stored in the second transistor Q2 are in a complementary relationship with each other. For example, when the corresponding bit of the key K is 0, the corresponding bit of the key/K is 1. Thus, corresponding bits of the first data and the second data in a complementary relationship with each other are written in the first transistor Q1 and the second transistor Q2, so that the threshold of the first transistor Q1 and the threshold of the second transistor Q2 have values different from each other. In the present description, the threshold of the first transistor Q1 is referred to as a first threshold, and the threshold of the second transistor Q2 is referred to as a second threshold.

Figures 3, 4, 5:
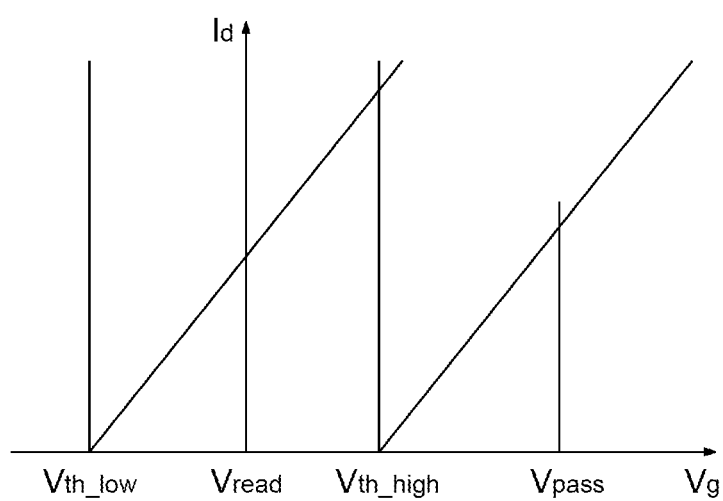
FIG. 3 is a view illustrating a correspondence relationship among a corresponding bit of a key K, a first threshold of the first transistor, and a second threshold of the second transistor.
FIG. 4 is a view illustrating a correspondence relationship between bit information of a query and a potential level.
FIG. 5 is a view illustrating a relationship between a gate voltage and a drain current of the first transistor and the second transistor.

FIG. 3 is a view illustrating a correspondence relationship among a corresponding bit of the key K (first data), the first threshold of the first transistor Q1, and the second threshold of the second transistor Q2. In the example of FIG. 3, the key K is 1-bit binary data. As illustrated in FIG. 3, when the corresponding bit of the key K is 0, the first threshold of the first transistor Q1 is Vth_low, and the second threshold of the second transistor Q2 is Vth_high. When the corresponding bit of the key K is 1, the first threshold of the first transistor Q1 is Vth_high, and the second threshold of the second transistor Q2 is Vth_low. Vth_high is a potential level higher than Vth_low. When the corresponding bit of the key K is X, both the first threshold of the first transistor Q1 and the second threshold of the second transistor Q2 are Vth_low. X corresponds to a case of don't care or undefined. Since the data X is not essential and is not related to the operation of the information processing apparatus according to the present embodiment, the description thereof is omitted in the present description.

Thus, when the corresponding bit of the key K (first data) is 1, the first threshold of the first transistor Q1 is larger than that when the corresponding bit of the key K (first data) is 0. Similarly, when the corresponding bit of the key/K (second data) is 1, the second threshold of the second transistor Q2 is larger than that when the corresponding bit of the key/K (second data) is 0.

FIG. 4 is a view illustrating a correspondence relationship between bit information and a potential level of the query Q (third data) supplied to the gates of the first transistor Q1 and the second transistor Q2 via the word lines WL1 and WL2. When the query Q includes a plurality of bits and the word lines WL1 connected to the gates of the first transistors Q1 in all the strings 1 are common and the word lines WL2 connected to the gates of the second transistors Q2 in all the strings 1 are common, each bit is sequentially supplied to the gate of the first transistor Q1 bit by bit. Each bit of the fourth data in a complement relationship of the third data is sequentially supplied to the gate of the second transistor Q2 bit by bit.

As illustrated in FIG. 4, when the bit of the query Q is 0, a voltage (first data) of a voltage level Vread is supplied to the gate of the first transistor Q1, and a voltage (second data) of a voltage level Vpass is supplied to the gate of the second transistor Q2. When the bit of the query Q is 1, the voltage (first data) of the voltage level Vpass is supplied to the gate of the first transistor Q1, and the voltage (second data) of the voltage level Vread is supplied to the gate of the second transistor Q2. As illustrated in FIG. 4, Vpass>Vread. Thus, the word lines WL1 and WL2 connected to the gates of the first transistor Q1 and the second transistor Q2 become at the potential level of Vpass or Vread. When the corresponding bit of the query Q is X, both of the word lines WL1 and WL2 connected to the gates of the first transistor Q1 and the second transistor Q2 become at the potential level of Vpass. X corresponds to a case of don't care or undefined. Since the data X is not essential and is not related to the operation of the information processing apparatus according to the present embodiment, the description thereof is omitted in the present description.

FIG. 5 is a view illustrating a relationship between a gate voltage Vg and a drain current Id of the first transistor Q1 and the second transistor Q2. As illustrated, there is a relationship of Vth_low<Vread<Vth_high<Vpass. Therefore, when the threshold of the first transistor Q1 is Vth_low, the first transistor Q1 is turned on regardless of whether the gate voltage of the first transistor Q1 is Vread or Vpass. Similarly, when the threshold of the second transistor Q2 is Vth_low, the second transistor Q2 is turned on regardless of whether the gate of the second transistor Q2 is Vread or Vpass.

When the threshold of the first transistor Q1 is Vth_high, the first transistor Q1 is turned on if the gate voltage of the first transistor Q1 is Vpass, and the first transistor Q1 is turned off if the gate voltage of the first transistor Q1 is Vread. Similarly, when the threshold of the second transistor Q2 is Vth_high, the second transistor Q2 is turned on if the gate voltage of the second transistor Q2 is Vpass, and the second transistor Q2 is turned off if the gate voltage of the second transistor Q2 is Vread.

As illustrated in FIG. 2, since the first transistor Q1 and the second transistor Q2 are cascode-connected in the same string 1, only when both the first transistor Q1 and the second transistor Q2 are turned on, a current flows from the bit line BL to the corresponding string 1, and the potential of the bit line BL is lowered. Even when one of the first transistor Q1 and the second transistor Q2 is on, if the other is off, no current flows through the corresponding string 1. Even when both the first transistor Q1 and the second transistor Q2 are off, no current flows through the corresponding string 1.

Thus, only when the first transistor Q1 and the second transistor Q2 are both turned on, the current flows from the bit line BL to the corresponding string 1, but the first transistor Q1 and the second transistor Q2 are both turned on when the values of the corresponding bits of the query Q and the key K match each other. That is, the first transistor Q1 is turned on when corresponding bits of the first data representing the key K and the third data representing the query Q match each other, and the second transistor Q2 is turned on when corresponding bits of the second data in a complement relationship with the first data and the fourth data in a complement relationship with the third data match each other.

FIG. 6 is a view illustrating all combinations of bits of the query Q and the key K. FIG. 6 illustrates an example in which each bit of the query Q and the key K is binary data. Note that FIG. 6 also illustrates a case where the bit values of the query Q and the key K are not only 0 and 1 but also X (don't care or undefined). Since the data X is not essential and is not related to the operation of the information processing apparatus according to the present embodiment, the description thereof is omitted in the present description.

FIG. 6 describes information on on or off of the first transistor Q1, information on on or off of the second transistor Q2, and information on a case where a current flows (ON) in the string 1 or does not flow (OFF) in the string 1. In the upper part of each column of FIG. 6, on or off of the first transistor and on or off of the second transistor are described on respective sides of a slash "l". In the lower part of each column, information on whether or not a current flows in the string 1 is described with ON (current flows) or OFF (current does not flow).

For example, when both of the corresponding bits of the query Q and the key K are zero, the first transistor Q1 is turned on and the second transistor Q2 is turned on, so that a current flows through the corresponding string 1 (ON). On the other hand, when the query Q is 1 and the key K is 0, the first transistor Q1 is turned on and the second transistor Q2 is turned off, and therefore no current flows through the corresponding string 1 (OFF).

As seen from FIG. 6, only when both the first transistor Q1 and the second transistor Q2 are turned on, a current flows through the corresponding string 1. Both the first transistor Q1 and the second transistor Q2 are turned on when both of the corresponding bits of the query Q and the key K are 1 or 0.

FIG. 7 is a view illustrating a specific example of the query Q and the key K. In the example of FIG. 7, both the query Q and the key K are 4-bit data, and each bit has a binary value. In FIG. 7, the query Q and the key K are compared for each bit, and the number of matching bits is expressed by a numerical value. In a case where the query Q is 1110, if the key K is 0100, the number of matching bits is 2. If the key K is 1100, the number of matching bits is 3. If the key K is 1110, the number of matching bits is 4. If the key K is 0111, the number of matching bits is 2.

Thus, each of the first transistors Q1 in the plurality of the strings 1 is turned on or off according to the comparison result between the corresponding bits of the first data representing the key K and the third data representing the query Q, and each of the second transistors Q2 in the plurality of the strings 1 is turned on or off according to the comparison result between the corresponding bits of the second data, which is the complement of the first data, and the fourth data, which is the complement of the third data.

When both the first transistor Q1 and the second transistor Q2 are turned on, the potential of the bit line BL is lowered. The larger the number of the strings 1 where both the first transistor Q1 and the second transistor Q2 are turned on is, the more the potential of the bit line BL is lowered.

The potential of the bit line BL changes according to the number of the strings 1 where both the first transistor Q1 and the second transistor Q2 are turned on among the plurality of the strings 1. When both the first transistor Q1 and the second transistor Q2 in the string 1 are turned on, a current flows from the bit line BL to the string 1.

Since the first transistor Q1 and the second transistor Q2 store the key K in a complementary relationship with each other, the potential level of the second threshold of the second transistor Q2 is set to becomes small as the potential level of the first threshold of the first transistor Q1 becomes large, and the potential level of the second threshold of the second transistor Q2 is set to become large as the potential level of the first threshold of the first transistor Q1 becomes small.

While FIGS. 3 to 7 illustrate examples in which each bit of the query Q and the key K is binary data, it is only possible to simply compare binary data only by comparing binary data of each bit. Recent nonvolatile memories can store multi-valued data of three values or more in memory cells, thereby increasing the storage capacity of the nonvolatile memories. By using a nonvolatile memory that can store multi-valued data, even if each bit of the query Q and the key K is multi-valued data, it is possible to compare the query Q and the key K, and the application range of the information processing apparatus according to the present embodiment is widened.

FIG. 8 is a view illustrating an example in which each bit of the query Q and the key K is multi-valued data. The example of FIG. 8 illustrates an example in which the query Q and the key K include 4 bits, each bit is multi-valued data, and the 4 bits of the query Q are q0, q1, q2, and q3. Assuming that the key K is k00, k10, k20, and k30, or k01, k11, k21, and k31, or k02, k12, k22, and k32, or k03, k13, k23, and k33, bitwise comparison between the query Q and the key K is expressed by the following Expression (1).

$$\overline{MDi} = \sum_{j=0}^{n} \overline{qJ \oplus kJi} \quad (1)$$

Expression (1) gives a value/MDi obtained by adding a calculated bitwise exclusive NOR (ExNOR) of the query Q and the key K. When each bit of the query Q and the key K is multi-valued data, the exclusive NOR is operated for each multi-valued data.

FIG. 9 is a view illustrating the first transistor Q1 and the second transistor Q2 in the string 1 when each bit of the query Q and the key K is 3-bit multi-valued data. In this case, each bit of the query Q and the key K can take eight potential levels including 3 bits. The key K (the first threshold of the first transistor Q1) stored in the first transistor Q1 and the key/K (the second threshold of the second transistor Q2) stored in the second transistor Q2 are in a complementary relationship with each other. When the first threshold of the first transistor Q1 is K, the second threshold of the second transistor Q2 is 7−K.

Similarly, since the query Q input to the gate of the first transistor Q1 and the query/Q input to the gate of the second transistor Q2 are in a complementary relationship with each other, when the query Q input to the gate of the first transistor Q1 is Q, the query/Q input to the gate of the second transistor Q2 is expressed by 7−Q.

FIG. 10 is a view illustrating a relationship between threshold and gate voltage of the first transistor Q1 and the second transistor Q2. The first threshold of the first transistor Q1 in each string 1 is a value corresponding to the multi-valued data of the corresponding bit of the key K input via the bit line BL.

Since the voltage level of the threshold slightly varies for each transistor, the potential level of the first threshold of the first transistor Q1 fluctuates within a predetermined range as illustrated in FIG. 10. This fluctuation range is called a threshold distribution. The first transistor Q1 is turned on when the potential level of the query Q supplied to the gate of the first transistor Q1 is larger than this threshold distribution. The first transistor Q1 is turned off when the potential level of the query Q is smaller than the threshold distribution. The same is true for the second transistor Q2.

From FIGS. 9 and 10, both the first transistor Q1 and the second transistor Q2 are turned on only when both of the following Expressions (2) and (3) are satisfied.

$$Q \geq K \quad (2)$$

$$7 - Q \geq 7 - K \quad (3)$$

Expression (4) is obtained by transforming Expression (3).

$$Q \leq K \quad (4)$$

A condition that satisfies both Expressions (2) and (4) is expressed by Expression (5).

$$Q = K \quad (5)$$

Thus, the first transistor Q1 and the second transistor Q2 in each string 1 are turned on only when the multi-valued data of the corresponding bits of the query Q and the key K match each other.

FIG. 11 is a view illustrating a correspondence relationship between multi-valued data of each bit of the query Q and the key K in the first embodiment. As illustrated in FIG. 11, each bit of the query Q has eight multi-valued data 0 to 7, and the key K (first threshold) also has eight multi-valued data 0 to 7. Similarly to FIG. 6, FIG. 11 describes information on on or off of the first transistor Q1, information on on or off of the second transistor Q2, and information on a case where a current flows (ON) in the string 1 or does not flow (OFF) in the string 1.

As seen from FIG. 11, the current flows in the string 1 only when the multi-valued data of the corresponding bits of the query Q and the key K match each other. The plurality of the strings 1 are connected to the same bit line BL, and when a current flows through each string 1, the current also flows through the bit line BL accordingly, and the potential of the bit line BL is lowered. The more the number of the strings 1 through which the current flows increases among the plurality of the strings 1, the more the current flows through the bit line BL, and the more the potential of the bit line BL is lowered. Therefore, by monitoring the potential of the bit line BL or the current flowing through the bit line BL, it is possible to quickly and accurately detect the number of matching bits of the query Q and the key K.

When the first data and the second data representing the key K are stored in the first transistor Q1 and the second transistor Q2 in the plurality of the strings 1, i.e., when the first threshold is set to the first transistor Q1 and the second threshold is set to the second transistor Q2, it is desirable to continuously or gradually switch the potential of the bit line BL based on the multi-valued data of each bit of the first data and the second data representing the key K and set the first threshold of the corresponding first transistor Q1 and the second threshold of the corresponding second transistor Q2 in order of the potential level. This enables efficient threshold setting of the first transistor Q1 and the second transistor Q2 in the plurality of the strings 1.

After the first data and the second data are stored in the first transistor Q1 and the second transistor Q2 in the plurality of the strings 1, the query Q and the key K are compared. When the word lines WL1 connected to the gates of the first transistors Q1 in all the strings 1 are common and the word lines WL2 connected to the gates of the second transistors Q2 in all the strings 1 are common, the potential levels of the two word lines WL1 and WL2 connected to the gates of the first transistors Q1 and the second transistors Q2 are sequentially changed according to the multi-valued data of each bit of the third data and the fourth data. Due to this, a current flows through each of the plurality of the strings 1 when corresponding bits of the first data and the third data match each other and corresponding bits of the second data and the fourth data match each other.

More specifically, the first transistor Q1 is turned on when the potential level corresponding to the corresponding bit of the third data input to the gate is equal to or greater than the potential level of the first threshold, and is turned off when the potential level corresponding to the corresponding bit of the third data is less than the potential level of the first threshold.

The second transistor Q2 is turned on when the potential level corresponding to the corresponding bit of the fourth data input to the gate is equal to or greater than the potential level of the second threshold, and is turned off when the potential level corresponding to the corresponding bit of the fourth data is less than the potential level of the second threshold.

The potential of the first wiring of the string 1 is lowered only when both the first transistor Q1 and the second transistor Q2 in the string 1 are turned on. The higher the matching degree between corresponding bits of the first data and the third data is, the more the potential of the bit line BL is lowered.

Thus, in the first embodiment, it is possible to determine whether or not each bit of the query Q and the key K matches using the first transistor Q1 and the second transistor Q2 in each of the plurality of the strings 1. Data in a complementary relationship with the key K is stored in the second transistor Q2, and data in a complementary relationship with the query Q is input to the gate of the second transistor Q2, so that both the first transistor Q1 and the second transistor Q2 can be turned on only when corresponding bits of the query Q and the key K match each other. Since a current flows through the corresponding string 1 only when both the first transistor Q1 and the second transistor Q2 are turned on, by detecting the potential or current of the bit line BL to which the plurality of the strings 1 are connected, it is possible to easily and quickly detect how many bits of the query Q and the key K including a plurality of bits match.

Second Embodiment

In the first embodiment, whether or not each bit of the query Q and the key K matches is detected. However, when each bit is multi-valued data, there is a need to detect not whether or not each bit of the query Q and the key K matches but whether or not each bit of the query Q and the key K is similar to each other. Therefore, the information processing apparatus according to the second embodiment lowers the potential of the bit line BL when the query Q is the same as the key K or the multi-valued data of each bit of the query Q and the key K are shifted by 1.

The information processing apparatus according to the second embodiment includes a plurality of the strings 1 similar to those in FIG. 1. Each of the plurality of the strings 1 includes the first transistor Q1 and the second transistor Q2. A condition under which the first transistor Q1 and the second transistor Q2 are turned on is different from that of the first embodiment (FIG. 9).

FIG. 12 is a view illustrating the first transistor Q1 and the second transistor Q2 in the string 1 according to the second embodiment. The data stored in the first transistor Q1 and the second transistor Q2 (multi-valued data of corresponding bits of the first data and the second data) are similar to those in FIG. 9, and by storing the data, the threshold of the first transistor Q1 becomes the first threshold and the threshold of the second transistor Q2 becomes the second threshold.

A signal of a voltage level corresponding to multi-valued data of the corresponding bit of the query Q (third data) is input to the gate of the first transistor Q1. A signal of a voltage level corresponding to multi-valued data of the corresponding bit of the fourth data in a complement relationship with the query Q is input to the gate of the second transistor Q2.

The first transistor Q1 is turned on not only when the corresponding bits of the query Q and the key K match each other but also when the multi-valued data of the corresponding bit of the query Q is smaller by one than the multi-valued data of the corresponding bit of the key K. The second transistor Q2 is turned on not only when the multi-valued data in a complement relationship with the multi-valued data of corresponding bits of the query Q and the key K match each other but also when the multi-valued data of the query/Q is smaller by 1 than the key/K.

In this case, when the multi-valued data of the corresponding bit of the query Q is Q, and the multi-valued data of the corresponding bit of the key K is K, it is necessary to satisfy two conditions of the following Expressions (6) and (7).

$$Q+1 \geq K \tag{6}$$

$$7-(Q-1) \geq 7-K \tag{7}$$

Expression (8) is obtained by transforming Expression (7).

$$Q-1 \leq K \tag{8}$$

A condition that satisfies both Expressions (6) and (8) is expressed by Expression (9).

$$Q-1 \leq K \leq Q+1 \tag{9}$$

Thus, each bit of the query Q and the key K matches, or each bit of the query Q is smaller by 1 than each bit of the key K when the multi-valued data of each bit of the key K and the query Q satisfies Expression (9).

FIG. 13 is a view illustrating a correspondence relationship between multi-valued data of each bit of the query Q and the key K in the second embodiment. As seen by comparing FIG. 13 with FIG. 11, in FIG. 13, the number of combinations in which both the first transistor Q1 and the second transistor Q2 are turned on is larger than that in FIG. 11. Specifically, both the first transistor Q1 and the second transistor Q2 are turned on when the multi-valued data of the corresponding bits of the query Q and the key K match and when the multi-valued data are shifted by 1.

The current flowing between drain-source of the first transistor Q1 in the string 1 changes according to the potential difference between the gate voltage and the first threshold of the first transistor Q1. The larger the potential difference is, the more the drain-source current increases. Similarly, the drain-source current of the second transistor Q2 changes according to the potential difference between the gate voltage and the second threshold of the second transistor Q2. The larger the potential difference is, the more the drain-source current of the second transistor Q2 increases.

Figure 14:
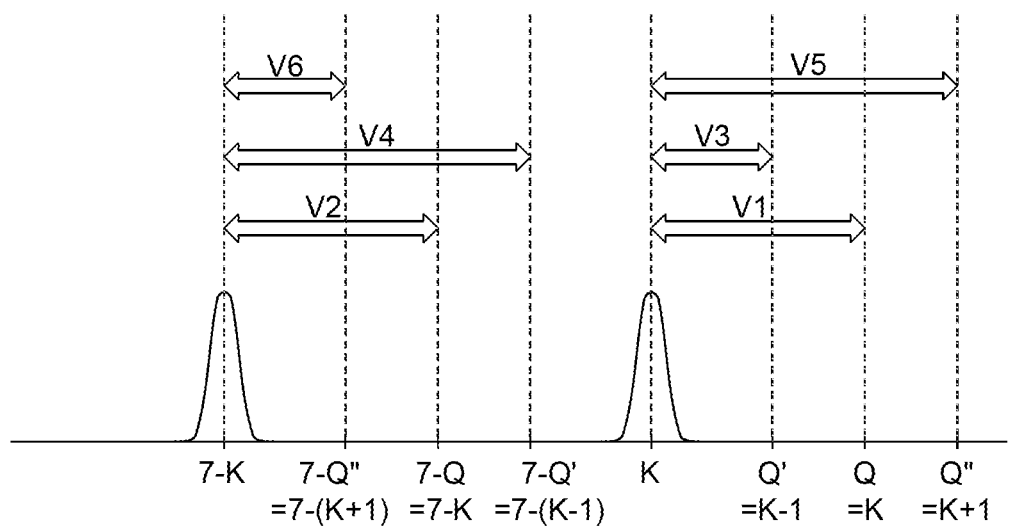
FIG. 14 is a view explaining a potential level of the query and the key.

FIG. 14 is a view explaining the potential level of the query Q and the key K. FIG. 14 illustrates the threshold distribution of the first threshold of the first transistor Q1, the threshold distribution of the second threshold of the second transistor Q2, the potential level of each bit of the query Q (third data) input to the gate of the first transistor Q1, and the potential level of each bit of the complement (fourth data) of the query Q input to the gate of the second transistor Q2.

A potential difference V1 between the gate voltage (Q=K) and the first threshold K of the first transistor Q1 when the multi-valued data of the corresponding bits of the query Q and the key K match is equal to a potential difference V2 between the gate voltage (7−Q=7−K) and the second threshold (7−K) of the second transistor Q2.

When the multi-valued data of corresponding bits of the query Q and the key K are shifted by 1, the potential difference between the gate voltage and the threshold of one of the first transistor Q1 and the second transistor Q2 becomes larger, and the potential difference between the gate voltage and the threshold of the other becomes smaller. Specifically, when the gate voltage (Q'=K−1) of the first transistor Q1 is smaller by 1 than the gate voltage (Q=K), a potential difference V3 between the gate voltage and the first threshold of the first transistor Q1 becomes smaller. At this time, the gate voltage (7−Q'=7−(K−1)) of the second transistor Q2 becomes larger by 1 than the gate voltage (Q=7−K), and a potential difference V4 between the gate voltage and the second threshold becomes larger. Conversely, when the gate voltage (Q"=K+1) of the first transistor Q1 is larger by 1 than the gate voltage (Q=K), a potential difference V5 between the gate voltage and the first threshold of the first transistor Q1 becomes larger. At this time, the gate voltage (7−Q"=7−(K+1)) of the second transistor Q2 becomes smaller by 1 than the gate voltage (Q=7−K), and a potential difference V6 between the gate voltage and the second threshold becomes smaller.

In general, the larger the potential difference between the gate voltage and the threshold of a transistor is, the larger the drain-source current of the transistor becomes. Since the first transistor Q1 and the second transistor Q2 in the string 1 are cascode-connected, the current flowing through the string 1 is the drain-source current of the transistor having the smaller potential difference between the gate voltage and the threshold.

As illustrated in FIG. 14, when the multi-valued data of the corresponding bits of the query Q and the key K are shifted by 1, the potential difference between the gate voltage and the threshold of one of the first transistor Q1 and the second transistor Q2 becomes larger, but the potential difference between the gate voltage and the threshold of the other becomes smaller. Therefore, the current flowing through the string 1 is the drain-source current of the transistor having the smaller potential difference between the gate voltage and the threshold.

Thus, also in a case where the multi-valued data of the corresponding bits of the query Q and the key K are shifted by 1, when the first transistor Q1 and the second transistor Q2 are caused to be turned on, the amount of current that can flow between the drain and source becomes different between the first transistor Q1 and the second transistor Q2. Since the first transistor Q1 and the second transistor Q2 are cascode-connected, the current flowing through the string 1 is determined by the potential difference between the gate voltage and the threshold voltage of the transistor that only allows a small current to flow.

Thus, in the information processing apparatus according to the second embodiment, each of the plurality of the strings 1 flows a current when corresponding bits of the first data and the third data match or are similar to each other and corresponding bits of the second data and the fourth data match or are similar to each other.

More specifically, the first transistor Q1 is turned on when in the first transistor Q1, the potential level corresponding to the corresponding bit of the third data input to the gate is equal to or greater than the first potential level within the range of a predetermined potential difference from the potential level of the first threshold. When the potential level corresponding to the corresponding bit of the third data is less than the first potential level, the first transistor Q1 is turned off. The predetermined potential difference is, for example, a potential difference in which the multi-valued data are shifted by 1.

The second transistor Q2 is turned on when in the second transistor Q2, the potential level corresponding to the corresponding bit of the fourth data input to the gate is equal to or greater than the second potential level within the range of the predetermined potential difference from the potential level of the second threshold. When the potential level corresponding to the corresponding bit of the fourth data is less than the second potential level, the second transistor Q2 is turned off.

The potential of the first wiring of the string 1 is lowered only when both the first transistor Q1 and the second transistor Q2 in the string 1 are turned on. When both the first transistor Q1 and the second transistor Q2 are turned on, the string 1 allows a drain-source current of the transistor having a smaller one of the potential difference between the first threshold and the first potential level and the potential difference between the second threshold and the second potential level to flow. The higher the matching degree between corresponding bits of the first data and the third data is, the more the potential of the bit line BL is lowered.

In FIGS. 12 and 13, the case where the multi-valued data of the corresponding bits of the query Q and the key K are shifted by 1 has been explained, but the first transistor Q1 and the second transistor Q2 may be turned on when the multi-valued data are shifted by 2 or more. In this case, the potential levels of the gates of the first transistor Q1 and the second transistor Q2 only need to be adjusted according to the multi-valued data of the query Q.

Thus, since the first transistor Q1 and the second transistor Q2 in the string 1 are cascode-connected, the current flowing through the string 1 is limited by one of the first transistor Q1 and the second transistor Q2 that has the smaller potential difference between the gate voltage and the threshold. Therefore, it is desirable to eliminate the above-described variation in potential difference as much as possible.

Figure 15:
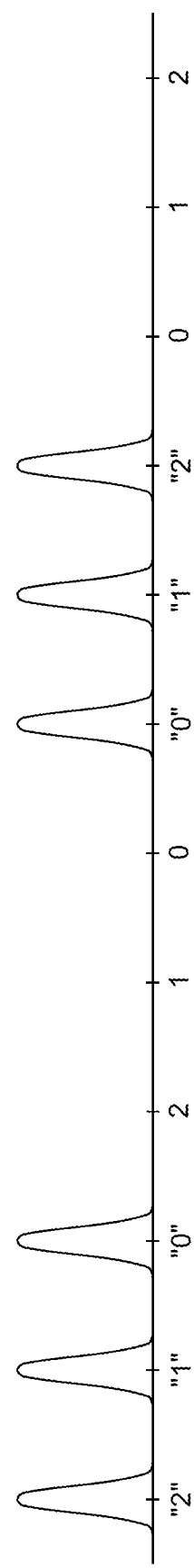
FIG. 15 is a view illustrating a relationship between the threshold and the gate voltage of the first transistor and the second transistor.

FIG. 15 is a view illustrating a relationship between threshold and gate voltage of the first transistor Q1 and the second transistor Q2. FIG. 15 illustrates three threshold distributions corresponding to the key K and three gate voltages corresponding to the query Q for each of the first transistor Q1 and the second transistor Q2.

When the differences between the multi-valued data of the corresponding bits of the query Q and the key K are equal, the potential difference between the gate voltages and the thresholds of the first transistor Q1 and the second transistor Q2 are made equal, whereby the variation in the current flowing through the string 1 can be suppressed. Therefore, the potential level of the word line WL connected to the gates of the first transistor Q1 and the second transistor Q2, and the first threshold of the first transistor Q1 and the second threshold of the second transistor Q2 are desirably arranged linearly as illustrated in FIG. 15. In this case, the current flowing through the string 1 with respect to the change in the difference between the multi-valued data of the query Q and the key K changes exponentially when the first transistor Q1 and the second transistor Q2 are operated in a subthreshold region. Each time the difference between the multi-valued data of the query Q and the key K increases by 1 bit, the current flowing through the string 1 decreases by 1/a (a is a real number larger than 1) times.

Thus, in the second embodiment, not only when the query Q and the key K match, but also when there is a shift within a predetermined range, the first transistor Q1 and the second transistor Q2 are turned on, and the current flowing through the string 1 changes according to the magnitude of the shift. Therefore, it is possible to easily and accurately detect the matching degree or the similarity degree between the query Q and the key K.

Third Embodiment

The information processing apparatus according to the third embodiment embodies the block configuration of the information processing apparatus according to the first and second embodiments described above.

Figure 16:
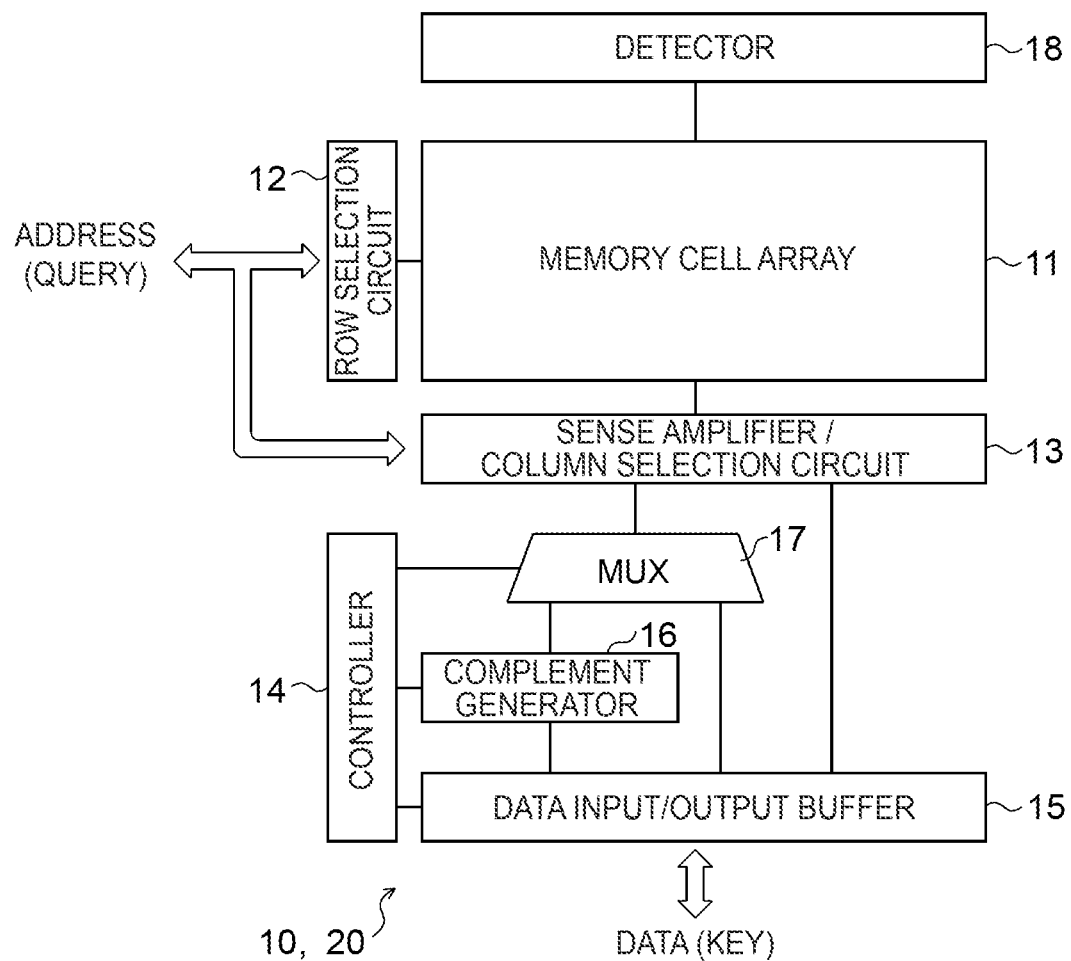
FIG. 16 is a block diagram illustrating a schematic configuration of an information processing apparatus according to a third embodiment.

FIG. 16 is a block diagram illustrating a schematic configuration of an information processing apparatus 10 according to the third embodiment. The information processing apparatus 10 of FIG. 16 includes a memory cell array 11, a row selection circuit 12, a sense amplifier/column selection circuit 13, a controller 14, a data input/output buffer 15, a complement generator 16, and a multiplexer 17.

Similarly to FIG. 1, the memory cell array 11 has a plurality of the strings 1 connected to the same bit line BL. A plurality of bit lines BL may be arranged in the memory cell array 11. In this case, the plurality of the strings 1 similar to those in FIG. 1 are provided for each bit line BL. Similarly to FIG. 1, each string 1 includes the first transistor Q1 and the second transistor Q2, and the word line WL set to a potential level corresponding to the query Q is connected to each gate of the first transistor Q1 and the second transistor Q2.

As illustrated in FIG. 1, in addition to the first transistor Q1 and the second transistor Q2, a plurality of transistors are cascode-connected to each string 1. The plurality of transistors are set to the ON state when the current of string 1 is read.

The row selection circuit 12 sets the potential level of the word line WL connected to each gate of the first transistor Q1 and the second transistor Q2 according to the query Q supplied from the outside in accordance with an instruction from the controller 14.

The data input/output buffer 15 acquires the key K from the outside, and supplies the acquired key K to the complement generator 16 and the multiplexer 17 in accordance with an instruction from the controller 14. The complement generator 16 inverts the key K from the data input/output buffer 15 for each bit to generate complement data of the key K. In accordance with an instruction from the controller 14, the multiplexer 17 selects any of the key K from the data input/output buffer 15 and the complement data of the key K generated by the complement generator 16, and supplies the same to the sense amplifier/column selection circuit 13. Note that a complement generator and a multiplexer may be similarly provided on the row selection circuit 12 side to which an address (query) is input. In accordance with an instruction from the controller 14, the multiplexer can select any of the query Q to be input and the complement data of the query Q generated by the complement generator 16 and supply the same to the word line WL via the row selection circuit 12.

The sense amplifier/column selection circuit 13 supplies, to the bit line BL, the key K or the complement data output from the multiplexer 17.

The memory cell array 11, the row selection circuit 12, the sense amplifier/column selection circuit 13, the controller 14, the data input/output buffer 15, the complement generator 16, and the multiplexer 17 illustrated in FIG. 16 can also be used as a memory system 20.

The information processing apparatus 10 in FIG. 16 may include a detector 18. The detector 18 detects at least one of the current flowing through the bit line BL and the voltage of the bit line BL. The detector 18 may output, to the outside, a digital signal obtained by analog-digital conversion of at least one of the current flowing through the bit line BL and the voltage of the bit line BL.

The information processing apparatus 10 of FIG. 16 may be able to select either a mode in which the memory cell array 11 is used as a normal memory or a mode in which the key K is stored in the memory cell array 11 and comparison with the query Q is performed.

The memory cell array 11 may include a memory cell region for storing the key K and comparing with the query Q, and a memory cell region used as a normal memory.

Thus, in the third embodiment, since the similar processing operation to that of the information processing apparatus 10 according to the first or second embodiment can be performed using the semiconductor memory having a configuration substantially equivalent to that of a normal memory, design is easy, and the information processing apparatus 10 can be manufactured using a short design time and an existing semiconductor process.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. An information processing apparatus comprising:
  a plurality of strings connected to a first wiring and connected to a plurality of second wirings, wherein
  the string has one end connected to the first wiring and includes a plurality of transistors being connected to each other, each of gates of the plurality of transistors being connected to corresponding one of the second wirings,
  the plurality of transistors include a first transistor and a second transistor, the first transistor being set to a first threshold according to first data, and the second transistor being set to a second threshold according to second data in a complement relationship with the first data,
  two second wirings of the plurality of second wirings are connected to gates of the first transistor and the second transistor, and
  one of the two second wirings is set to a potential level corresponding to third data, and another of the two second wirings is set to a potential level corresponding to fourth data in a complement relationship with the third data.

2. The information processing apparatus according to claim 1, wherein
  the first transistor is turned on or off according to a comparison result between corresponding bits of the first data and the third data, and the second transistor is turned on or off according to a comparison result between corresponding bits of the second data and the fourth data.

3. The information processing apparatus according to claim 1, wherein
when both the first transistor and the second transistor are turned on, a potential of the first wiring is lowered.

4. The information processing apparatus according to claim 3, wherein
a potential of the first wiring is lowered more as a number of the strings where both the first transistor and the second transistor are turned on is larger.

5. The information processing apparatus according to claim 3, wherein
a potential of the first wiring changes according to a number of the strings where both the first transistor and the second transistor are turned on among the plurality of strings.

6. The information processing apparatus according to claim 1, wherein
when both the first transistor and the second transistor in the string are turned on, a current flows from the first wiring to the string.

7. The information processing apparatus according to claim 1, wherein
potential levels of the first threshold and the second threshold are set according to a multi-value of three values or more, and the two second wirings have potential levels of a multi-value of three values or more.

8. The information processing apparatus according to claim 7, wherein
a potential level of the second threshold of the second transistor is set to become smaller as a potential level of the first threshold of the first transistor becomes larger, and
a potential level of the second threshold of the second transistor is set to become larger as a potential level of the first threshold of the first transistor becomes smaller.

9. The information processing apparatus according to claim 7, wherein
when the first threshold of the first transistor and the second threshold of the second transistor included in each of the plurality of strings are set, a potential of the first wiring is continuously or gradually switched based on multi-valued data of each bit of the first data and the second data, and the first threshold of the first transistor and the second threshold of the second transistor are set in order of potential levels.

10. The information processing apparatus according to claim 8, wherein
after setting of the first threshold of the first transistor and the second threshold of the second transistor included in each of the plurality of strings, potential levels of the two second wirings sequentially change according to multi-valued data of each bit of the third data and the fourth data, and
each of the plurality of strings allows a current to flow when corresponding bits of the first data and the third data match each other and corresponding bits of the second data and the fourth data match each other.

11. The information processing apparatus according to claim 8, wherein
each of the plurality of strings allows a current to flow when corresponding bits of the first data and the third data match or are similar to each other and corresponding bits of the second data and the fourth data match or are similar to each other.

12. The information processing apparatus according to claim 10, wherein
the first transistor is turned on when a potential level corresponding to a bit of the third data input to a gate is equal to or greater than the potential level of the first threshold, and is turned off when a potential level corresponding to a bit of the third data is less than the potential level of the first threshold,
the second transistor is turned on when a potential level corresponding to a bit of the fourth data input to a gate is equal to or greater than the potential level of the second threshold, and is turned off when a potential level corresponding to a bit of the fourth data is less than the potential level of the second threshold, and
the string lowers a potential of the first wiring when both the first transistor and the second transistor in the string are turned on.

13. The information processing apparatus according to claim 11, wherein
the first transistor is turned on when a potential level corresponding to a bit of the third data input to a gate of the first transistor is equal to or greater than a first potential level within a range of a predetermined potential difference from the potential level of the first threshold, and the first transistor is turned off when a potential level corresponding to a bit of the third data is less than the first potential level,
the second transistor is turned on when a potential level corresponding to a bit of the fourth data input to a gate of the second transistor is equal to or greater than a second potential level within a range of a predetermined potential difference from the potential level of the second threshold, and the second transistor is turned off when a potential level corresponding to a bit of the fourth data is less than the second potential level, and
the string lowers a potential of the first wiring when both the first transistor and the second transistor in the string are turned on.

14. The information processing apparatus according to claim 13, wherein
when both the first transistor and the second transistor are turned on, the string allows a drain-source current of a transistor having a smaller one of a potential difference between the first threshold and the first potential level and a potential difference between the second threshold and the second potential level to flow.

15. The information processing apparatus according to claim 11, wherein
as a matching degree between corresponding bits of the first data and the third data is higher, a potential of the first wiring is lowered more.

16. The information processing apparatus according to claim 1 comprising
a detector that detects at least one of a current flowing through the first wiring and a voltage of the first wiring.

17. The information processing apparatus according to claim 1, wherein
the first wiring is a bit line,
the second wiring is a word line, and
the information processing apparatus includes a nonvolatile memory that includes the plurality of strings.

18. The information processing apparatus according to claim 17, wherein
the nonvolatile memory is a NAND flash memory, and
charges corresponding to bits of the first data and the second data are accumulated in charge accumulation regions of the first transistor and the second transistor.

19. A memory system comprising:
a nonvolatile memory; and
a controller that controls writing and reading of data to and from the nonvolatile memory, wherein
the nonvolatile memory includes
a plurality of strings connected to a first wiring and connected to a plurality of second wirings,
the string has one end connected to the first wiring and includes a plurality of transistors being connected to each other, each of gates of the plurality of transistors being connected to corresponding one of the second wirings,
the plurality of transistors include a first transistor and a second transistor, the first transistor being set to a first threshold according to first data, and the second transistor being set to a second threshold according to second data in a complement relationship with the first data,
two second wirings of the plurality of second wirings are connected to gates of the first transistor and the second transistor, and
one of the two second wirings is set to a potential level corresponding to third data, and another of the two second wirings is set to a potential level corresponding to fourth data in a complement relationship with the third data.

20. The memory system according to claim 19, wherein
the first transistor is turned on or off according to a comparison result between corresponding bits of the first data and the third data, and
the second transistor is turned on or off according to a comparison result between corresponding bits of the second data and the fourth data.

* * * * *